US011751389B2

(12) United States Patent
Wang

(10) Patent No.: US 11,751,389 B2
(45) Date of Patent: Sep. 5, 2023

(54) THREE-DIMENSIONAL MEMORY DEVICE WITH REDUCED MEMORY UNIT INTERFERENCE AND MANUFACTURING METHOD THEREOF

(71) Applicant: Yangtze Memory Technologies Co., Ltd., Wuhan (CN)

(72) Inventor: Qiguang Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/664,932

(22) Filed: Oct. 27, 2019

(65) Prior Publication Data

US 2021/0091106 A1 Mar. 25, 2021

Related U.S. Application Data

(63) Continuation of application No. PCT/CN2019/106881, filed on Sep. 20, 2019.

(51) Int. Cl.
*H10B 43/27* (2023.01)
*H10B 43/35* (2023.01)

(52) U.S. Cl.
CPC .............. *H10B 43/27* (2023.02); *H10B 43/35* (2023.02)

(58) Field of Classification Search
CPC ........... H01L 27/11582; H01L 27/1157; H10B 43/35; H10B 43/27
See application file for complete search history.

(56) References Cited

U.S. PATENT DOCUMENTS

| | | | |
|---|---|---|---|
| 9,875,929 B1 | 1/2018 | Shukla | |
| 10,153,298 B2 | 12/2018 | Sun | |
| 2009/0321813 A1* | 12/2009 | Kidoh | H01L 29/42348 257/E21.423 |
| 2013/0248977 A1 | 9/2013 | Mori | |
| 2015/0294980 A1* | 10/2015 | Lee | H01L 21/76877 438/591 |
| 2015/0380431 A1 | 12/2015 | Kanamori | |
| 2016/0086972 A1 | 3/2016 | Zhang | |

(Continued)

FOREIGN PATENT DOCUMENTS

| | | |
|---|---|---|
| CN | 107579068 A | 1/2018 |
| CN | 108878438 A | 11/2018 |

(Continued)

*Primary Examiner* — Didarul A Mazumder
*Assistant Examiner* — Gustavo G Ramallo
(74) *Attorney, Agent, or Firm* — Winston Hsu

(57) ABSTRACT

A three-dimensional (3D) memory device and a manufacturing method thereof are provided. The 3D memory device includes a substrate, insulation layers, gate material layers, and a vertical structure. The insulation layers and the gate material layers are disposed on the substrate and alternately stacked in a vertical direction. The vertical structure penetrates the gate material layers in the vertical direction. The vertical structure includes a semiconductor layer and a trapping layer. The semiconductor layer is elongated in the vertical direction. The trapping layer surrounds the semiconductor layer in a horizontal direction. The trapping layer includes trapping sections aligned in the vertical direction and separated from one another. The electrical performance of the 3D memory device may be improved by the trapping sections separated from one another.

9 Claims, 15 Drawing Sheets

(56) References Cited

U.S. PATENT DOCUMENTS

| | | | |
|---|---|---|---|
| 2017/0148809 A1 | 5/2017 | Nishikawa | |
| 2017/0194154 A1* | 7/2017 | Yu | H01L 21/28194 |
| 2018/0033799 A1* | 2/2018 | Kanamori | H01L 27/11582 |
| 2018/0182771 A1 | 6/2018 | Costa | |
| 2018/0219017 A1 | 8/2018 | Goda | |
| 2018/0254187 A1 | 9/2018 | Purayath | |
| 2019/0051656 A1* | 2/2019 | Carlson | H01L 29/40117 |
| 2019/0051660 A1* | 2/2019 | Carlson | H01L 27/11582 |
| 2019/0109190 A1* | 4/2019 | Carlson | H01L 27/11582 |

FOREIGN PATENT DOCUMENTS

| | | |
|---|---|---|
| CN | 109314116 A | 2/2019 |
| CN | 109326608 A | 2/2019 |
| CN | 110114880 A | 8/2019 |
| JP | 2013-201270 A | 10/2013 |
| JP | 2017-174866 A | 9/2017 |
| JP | 2019-153626 A | 9/2019 |
| JP | 2020-530657 A | 10/2020 |
| TW | 201535390 A | 9/2015 |
| TW | 201539454 A | 10/2015 |
| TW | 201606993 A | 2/2016 |
| TW | 201620077 A | 6/2016 |
| TW | 201836128 A | 10/2018 |
| TW | 201926647 A | 7/2019 |
| WO | 2016/032838 A2 | 3/2016 |
| WO | 2019/032323 A1 | 2/2019 |

* cited by examiner

THREE-DIMENSIONAL MEMORY DEVICE WITH REDUCED MEMORY UNIT INTERFERENCE AND MANUFACTURING METHOD THEREOF

CROSS REFERENCE TO RELATED APPLICATIONS

This application is a continuation of International Application No. PCT/CN2019/106881 filed on Sep. 20, 2019, which is incorporated herein by reference in its entirety.

BACKGROUND OF THE INVENTION

1. Field of the Invention

The present disclosure relates to a memory device and a manufacturing method thereof, and more particularly, to a three-dimensional (3D) memory device and a manufacturing method thereof.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral devices for controlling signals to and from the memory array. In conventional 3D memory architecture, memory strings are formed in channel holes penetrating a multiple layer stack structure on a semiconductor substrate. An epitaxial structure is formed at the bottom of each channel hole for electrically connecting a channel layer of the memory string and the semiconductor substrate. However, as the amount of the layers in the stack structure increases and each layer in the stack structure becomes thinner for higher storage density, some issues become serious and influence the electrical performance and manufacturing yield of the 3D memory device. Therefore, the structure and/or the manufacturing processes of the 3D memory device have to be modified for improving the electrical performance and/or the manufacturing yield of the 3D memory device.

SUMMARY OF THE INVENTION

A three-dimensional (3D) memory device and a manufacturing method thereof are provided in the present disclosure. A trapping layer includes a plurality of trapping sections aligned in a vertical direction and separated from one another for improving the electrical performance of the 3D memory device.

According to an embodiment of the present disclosure, a 3D memory device is provided. The 3D memory device includes a substrate, insulation layers, gate material layers, and a vertical structure. The insulation layers and the gate material layers are disposed on the substrate and alternately stacked in a vertical direction. The vertical structure penetrates the gate material layers in the vertical direction. The vertical structure includes a semiconductor layer and a trapping layer. The semiconductor layer is elongated in the vertical direction. The trapping layer surrounds the semiconductor layer in a horizontal direction. The trapping layer includes trapping sections aligned in the vertical direction and separated from one another.

In some embodiments, one of the trapping sections is located between the semiconductor layer and one of the gate material layers in the horizontal direction.

In some embodiments, one of the insulation layers is partially located between two of the trapping sections adjacent to each other in the vertical direction.

In some embodiments, a length of each of the trapping sections in the vertical direction is less than a length of each of the gate material layers in the vertical direction.

In some embodiments, the 3D memory device further includes an air void disposed in at least one of the insulation layers, and the air void is located between two of the gate material layers adjacent to each other in the vertical direction.

In some embodiments, the vertical structure further includes a blocking layer surrounding the trapping layer and the semiconductor layer in the horizontal direction, and the blocking layer comprises blocking sections aligned in the vertical direction and separated from one another.

In some embodiments, one of the blocking sections is disposed between one of the trapping sections and one of the gate material layers in the horizontal direction.

In some embodiments, the vertical direction is orthogonal to the horizontal direction.

According to an embodiment of the present disclosure, a manufacturing method of a 3D memory device is provided. The manufacturing method includes the following steps. An alternating sacrificial stack is formed on a substrate. The alternating sacrificial stack includes first sacrificial layers and second sacrificial layers alternately stacked in a vertical direction. A vertical structure is formed penetrating the alternating sacrificial stack in the vertical direction. The vertical structure includes a semiconductor layer and a trapping layer. The semiconductor layer is elongated in the vertical direction. The trapping layer surrounds the semiconductor layer in a horizontal direction. The first sacrificial layers are removed for exposing a part of the vertical structure. A first etching process is performed after the first sacrificial layers are removed. The trapping layer is etched by the first etching process to include trapping sections aligned in the vertical direction and separated from one another.

In some embodiments, the vertical structure further includes a blocking layer surrounding the trapping layer and the semiconductor layer in the horizontal direction, and the manufacturing method of the 3D memory device further includes performing a second etching process after the first sacrificial layers are removed and before the first etching process. The blocking layer is etched by the second etching process to expose a part of the trapping layer.

In some embodiments, the manufacturing method of the 3D memory device further includes forming insulation layers between the second sacrificial layers. The insulation layers and the second sacrificial layers are alternately stacked in the vertical direction.

In some embodiments, an air void is formed in at least one of the insulation layers.

In some embodiments, one of the insulation layers is partially located between two of the trapping sections adjacent to each other in the vertical direction.

In some embodiments, the manufacturing method of the 3D memory device further includes replacing the second sacrificial layers with gate material layers after the step of forming the insulation layers.

In some embodiments, an air void is formed in at least one of the insulation layers, and the air void is located between two of the gate material layers adjacent to each other in the vertical direction.

In some embodiments, one of the trapping sections is located between the semiconductor layer and one of the gate material layers in the horizontal direction.

In some embodiments, a length of each of the trapping sections in the vertical direction is less than a length of each of the gate material layers in the vertical direction.

In some embodiments, the vertical structure further comprises an epitaxial layer disposed between the substrate and the trapping layer, and a part of the epitaxial layer is oxidized to be an oxide region after the second sacrificial layers are removed and before the gate material layers are formed.

In some embodiments, the oxide region is located between the epitaxial layer and one of the gate material layers in the horizontal direction.

In some embodiments, the vertical direction is orthogonal to the horizontal direction.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 4-15 are schematic drawings illustrating a manufacturing method of a 3D memory device according to an embodiment of the present disclosure, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, and FIG. 15 is a schematic drawing in a step subsequent to FIG. 14.

DETAILED DESCRIPTION

Figure 1:
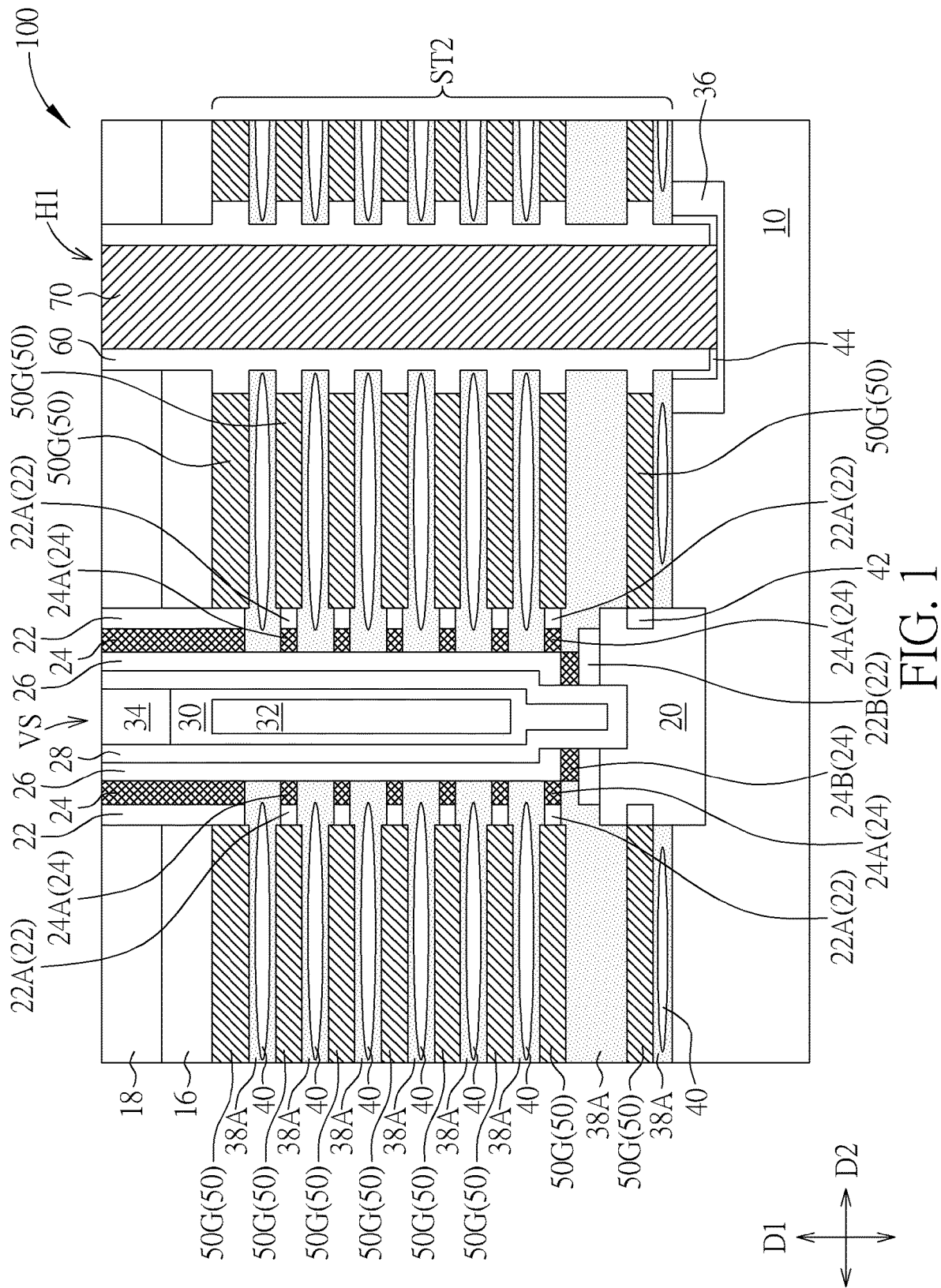
FIG. 1 is a schematic drawing illustrating a three-dimensional (3D) memory device according to an embodiment of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "forming" or the term "disposing" are used hereinafter to describe the behavior of applying a layer of material to an object. Such terms are intended to describe any possible layer forming techniques including, but not limited to, thermal growth, sputtering, evaporation, chemical vapor deposition, epitaxial growth, electroplating, and the like.

Figure 2:
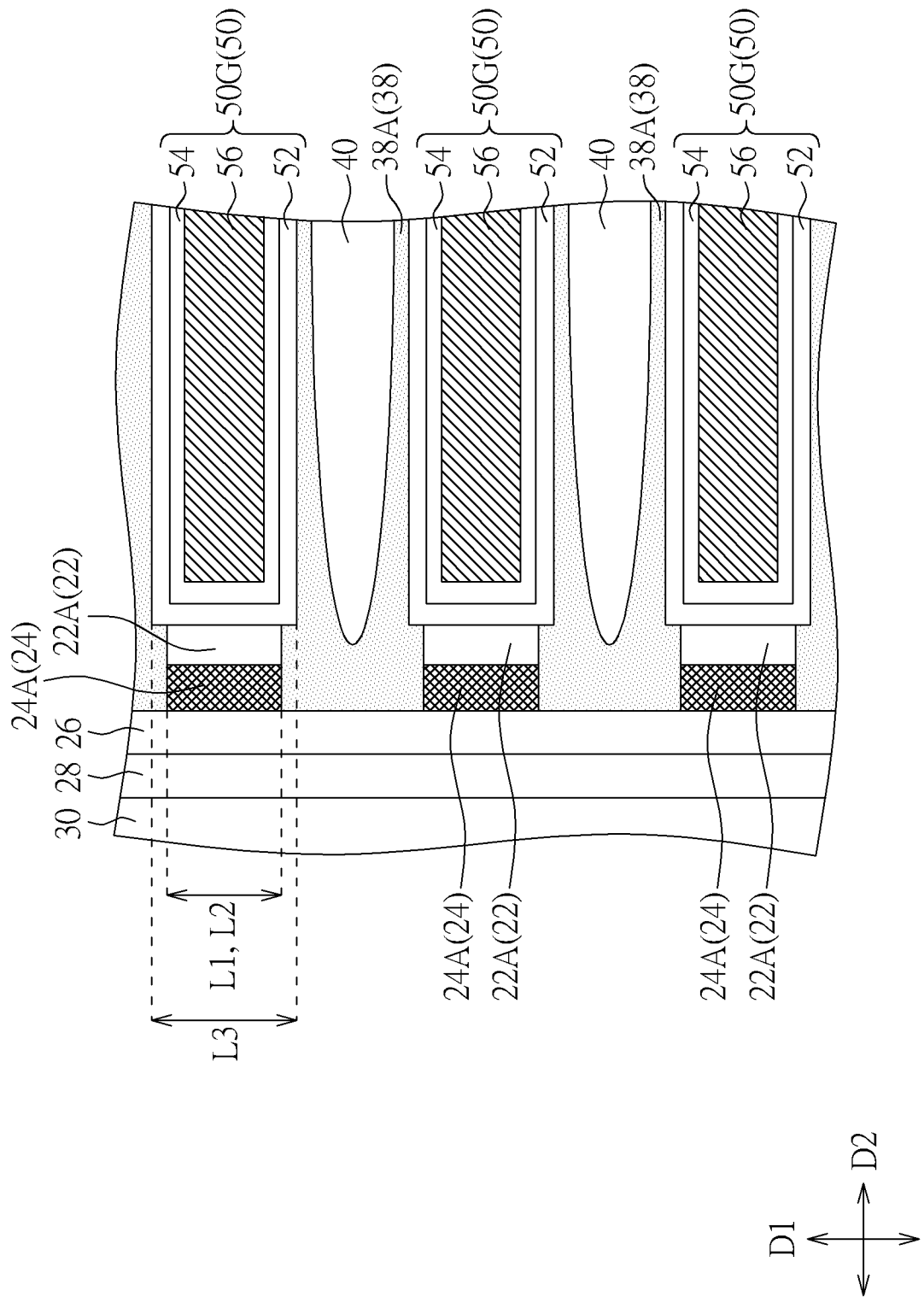
FIG. 2 is a schematic drawing illustrating a portion of the 3D memory device shown in FIG. 1.

Please refer to FIG. 1 and FIG. 2. FIG. 1 is a schematic drawing illustrating a three-dimensional (3D) memory device according to an embodiment of the present disclosure, and FIG. 2 is a schematic drawing illustrating a portion of the 3D memory device shown in FIG. 1. As shown in FIG. 1 and FIG. 2, a 3D memory device 100 is provided in this embodiment. The 3D memory device 100 includes a substrate 10, a plurality of insulation layers 38A, a plurality of gate material layers 50G, and a vertical structure VS. The insulation layers 38A and the gate material layers 50G are disposed on the substrate 10 and alternately stacked in a vertical direction D1. In some embodiments, the vertical direction D1 may be regarded as a thickness direction of the substrate 10, and the vertical direction D1 may be orthogonal to a top surface of the substrate 10, but not limited thereto. The vertical structure VS penetrates the gate material layers 50G in the vertical direction D1. The vertical structure VS includes a semiconductor layer 28 and a trapping layer 24. The semiconductor layer 28 is elongated in the vertical direction D1. The trapping layer 24 surrounds the semiconductor layer 28 in a horizontal direction D2. The vertical direction D1 may be orthogonal to the horizontal direction D2, and the horizontal direction D2 may be parallel to the top surface of the substrate 10, but not limited thereto. The trapping layer 24 includes a plurality of trapping sections, such as a plurality of first trapping sections 24A and a second trapping section 24B. The first trapping sections 24A may be disposed above the second trapping section 24B in the vertical direction D1, and the first trapping sections 24A may be aligned in the vertical direction D1 and separated from one another.

In some embodiments, the vertical structure VS may further include an epitaxial layer 20, a blocking layer 22, a tunneling layer 26, a filling layer 30, and a conductive structure 34. The blocking layer 22 may surround the trapping layer 24, the tunneling layer 26, the semiconductor layer 28, and the filling layer 30 in the horizontal direction D2. The tunneling layer 26 may be disposed between the semiconductor layer 28 and the trapping layer 24, and the filling layer 30 may be surrounded by the semiconductor layer 28, the tunneling layer 26, the trapping layer 24, and the blocking layer 22 in the horizontal direction D2. In some embodiments, the vertical structure VS may be regarded as an NAND string penetrating an alternating dielectric/gate material stack ST2 in the vertical direction D1, but not limited thereto. In some embodiments, the vertical structure VS may have a cylinder shape elongated in the vertical direction D1, and the semiconductor layer 28, the tunneling layer 26, the trapping layer 24, and the blocking layer 22 may be arranged radially from the center of the center of the cylinder toward the outer surface of the cylinder in this order, but not limited thereto.

In some embodiments, a bottom portion of the blocking layer 22, a bottom portion of the trapping layer 24, and a bottom portion of the tunneling layer 26 may be stacked in the vertical direction D1 and disposed on the epitaxial layer 20. Therefore, the epitaxial layer 20 may be disposed between the blocking layer 22 and the substrate 10 in the vertical direction D1. In some embodiments, an opening may penetrate the bottom portion of the blocking layer 22, the bottom portion of the trapping layer 24, and the bottom portion of the tunneling layer 26 in the vertical direction D1 and expose a part of the epitaxial layer 20, and the semiconductor layer 28 may be partially disposed in this opening for contacting and being directly electrically connected with the epitaxial layer 20, but not limited thereto. In some embodiments, the epitaxial layer 20 may be regarded as a channel structure of a bottom select gate (BSG) transistor in a NAND memory structure, and the semiconductor layer 28 may be electrically connected to a doped well (not shown) in the substrate 10 via the epitaxial layer 20, but not limited thereto. In some embodiments, one or more air voids (such as a first air void 32 shown in FIG. 1) may be disposed in the filling layer 30, and the conductive structure 34 may be disposed above the filling layer 30 and be directly connected with the semiconductor layer 28, but not limited thereto.

In some embodiments, at least some of the gate material layers 50G in the alternating dielectric/gate material stack ST2 may be used as a gate structure in a memory unit, and the memory unit may include a part of the blocking layer 22, a part of the trapping layer 24, a part of the tunneling layer 26, and a part of the semiconductor layer 28 surrounded by the gate material layer 50G in the horizontal direction D2. In other words, the 3D memory devise 100 may include a plurality of the memory units stacked in the vertical direction D1. In some embodiments, the gate material layer 50G may be a single layer of conductive material or multiple layers of different materials. For example, each of the gate material layers 50G may include a gate dielectric layer 52, a barrier layer 54, and a metal layer 56, but not limited thereto. In each of the gate material layers 50G, the gate dielectric layer 52 may be partly disposed between the metal layer 56 and the blocking layer 22 in the horizontal direction D2 and partly disposed between the metal layer 56 and the insulation layer 38A in the vertical direction D1, and the barrier layer 54 may be disposed between the gate dielectric layer 52 and the metal layer 56.

As shown in FIG. 1 and FIG. 2, one of the first trapping sections 24A may be located between the semiconductor layer 28 and one of the gate material layers 50G in the horizontal direction D2. Each of the first trapping sections 24A may be located corresponding to one of the gate material layers 50G in the horizontal direction D2, and the first trapping sections 24A located corresponding to different gate material layers 50G are separated from one another for reducing interference between adjacent memory units, such as lateral spreading of charge in a continuous trapping layer located corresponding to a plurality of memory units arranged in the vertical direction D1 and/or coupling effect generated by charge trapped in a trapping layer located between the insulation layer 38A and the semiconductor layer 28 in the horizontal direction D2. In other words, the first trapping sections 24A disposed separated from one another may belong to different memory units respectively for improving the electrical performance (such as charge trapping and/or charge maintaining ability) of the 3D memory device 100 because the lateral spreading of charge in a continuous trapping layer and/or charge trapped in a trapping layer located between the insulation layer 38A and the semiconductor layer 28 in the horizontal direction D2 may be avoided accordingly.

In some embodiments, the blocking layer 22 may include a plurality of first blocking sections 22A and a second blocking section 22B. The first blocking sections 22A may be disposed above the second blocking section 22B in the vertical direction D1, and the first blocking sections 22A may be aligned in the vertical direction D1 and separated from one another. In some embodiments, each of the first blocking sections 22A may be located between one of the first trapping sections 24A and one of the gate material layers 50G in the horizontal direction D2, and the first blocking sections 22A disposed separated from one another may belong to different memory units respectively. In some embodiments, one of the insulation layers 38A may be partially located between two of the first trapping sections 24A adjacent to each other in the vertical direction D1. In other words, two of the first trapping sections 24A adjacent to each other in the vertical direction D1 may be separated by the insulation layer 38A. Additionally, in some embodiments, the 3D memory device 100 may further include a second air void 40 disposed in at least one of the insulation layers 38A. In some embodiments, the second air void 40 may be located between two of the gate material layers 50G adjacent to each other in the vertical direction D1 for reducing the capacitance between the gate material layers 50G and improving RC delay issue between the gate material layers 50G. In some embodiments, the second air void 40 may be partially located between two of the first blocking sections 22A disposed adjacent to each other in the vertical direction D1 and/or be partially located between two of the first trapping sections 24A disposed adjacent to each other in the vertical direction D1 for further reducing the interference issue between adjacent memory units, but not limited thereto. In some embodiments, a length L1 of each of the first trapping sections 24A in the vertical direction D1 may be less than a length L3 of each of the gate material layers 50G in the vertical direction D1 for avoiding forming the trapping layer 24 between the insulation layer 38A and the semiconductor layer 28 in the horizontal direction D2. In some embodiments, a length L2 of each of the first blocking sections 22A in the vertical direction D1 may be less than the length L3 of each of the gate material layers 50G in the vertical direction D1 also, but not limited thereto.

In some embodiments, the 3D memory device 100 may further include a first cap layer 16, a second cap layer 18, a doped region 36, a first oxide region 42, a second oxide region 44, a second insulation material 60, a slit structure 70, and a first opening H1. The first cap layer 16 and the second cap layer 18 may be disposed on the alternating dielectric/gate material stack ST2, and the vertical structure VS may further penetrate the second cap layer 18 and the first cap layer 16. The first oxide region 42 may be disposed in the epitaxial layer 20, and the first oxide region 42 may be located between the epitaxial layer 20 and one of the gate material layer 50G in the horizontal direction D2. In some embodiments, the first oxide region 42 may be regarded as a part of a gate dielectric layer of a BSG transistor in a NAND memory structure, but not limited thereto. The doped region 36 may be disposed in the substrate 10, and the second oxide region 44 may be disposed on the doped region 36. The first opening H1 may penetrate the second cap layer 18, the first cap layer 16, and the alternating dielectric/gate material stack ST2 located above the doped region 36 in the vertical direction D1. The slit structure 70 may be disposed in the first opening H1 and penetrate the second oxide region 44 above the doped region 36 for being contacting and electrically connected with the doped region 36. The second insulation material 60 may be disposed in the first opening H1 and surround the slit structure 70 in the horizontal direction D2 for insulating the slit structure 70 from the gate material layers 50G. In some embodiments, the doped region 36 may be an N-type doped region when the substrate 10 is a P-type semiconductor substrate, the doped region 36 may be regarded as a common source region, and the slit structure 70 may be regarded as a source contact structure, but not limited thereto.

Figure 3:
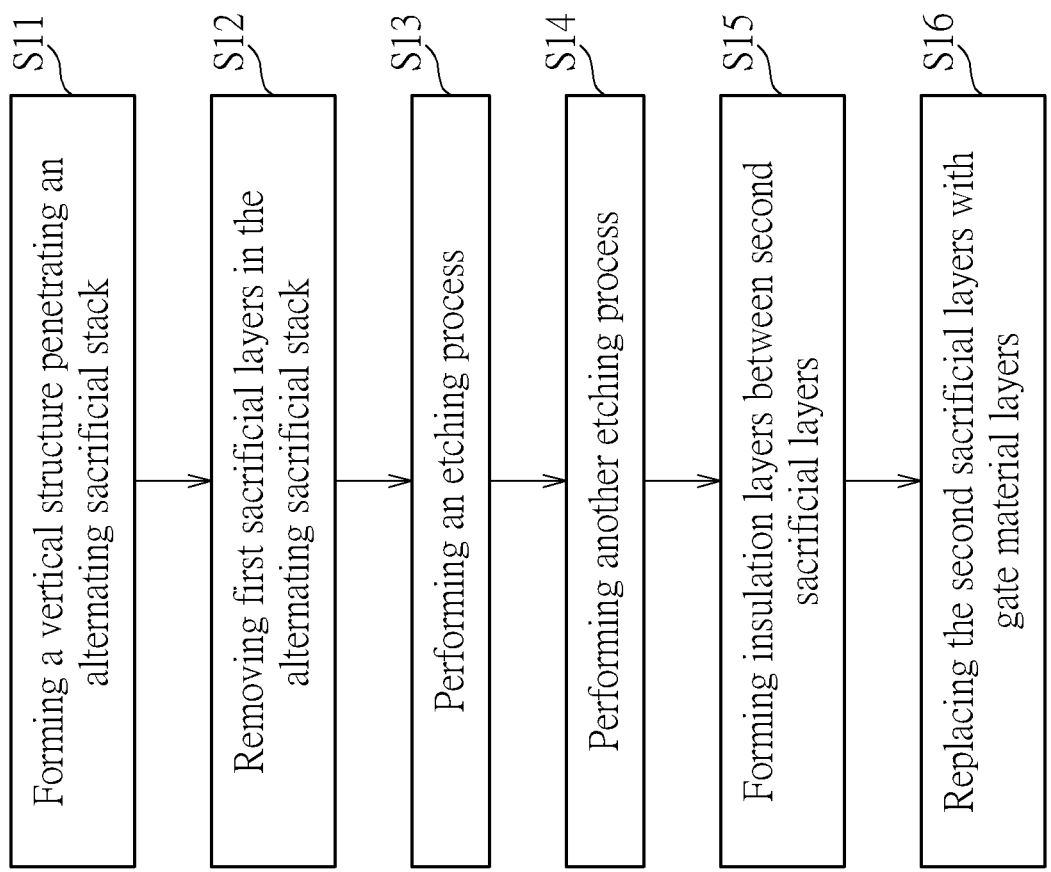
FIG. 3 is a flowchart of a manufacturing method of a 3D memory device according to an embodiment of the present disclosure.
Figure 4:
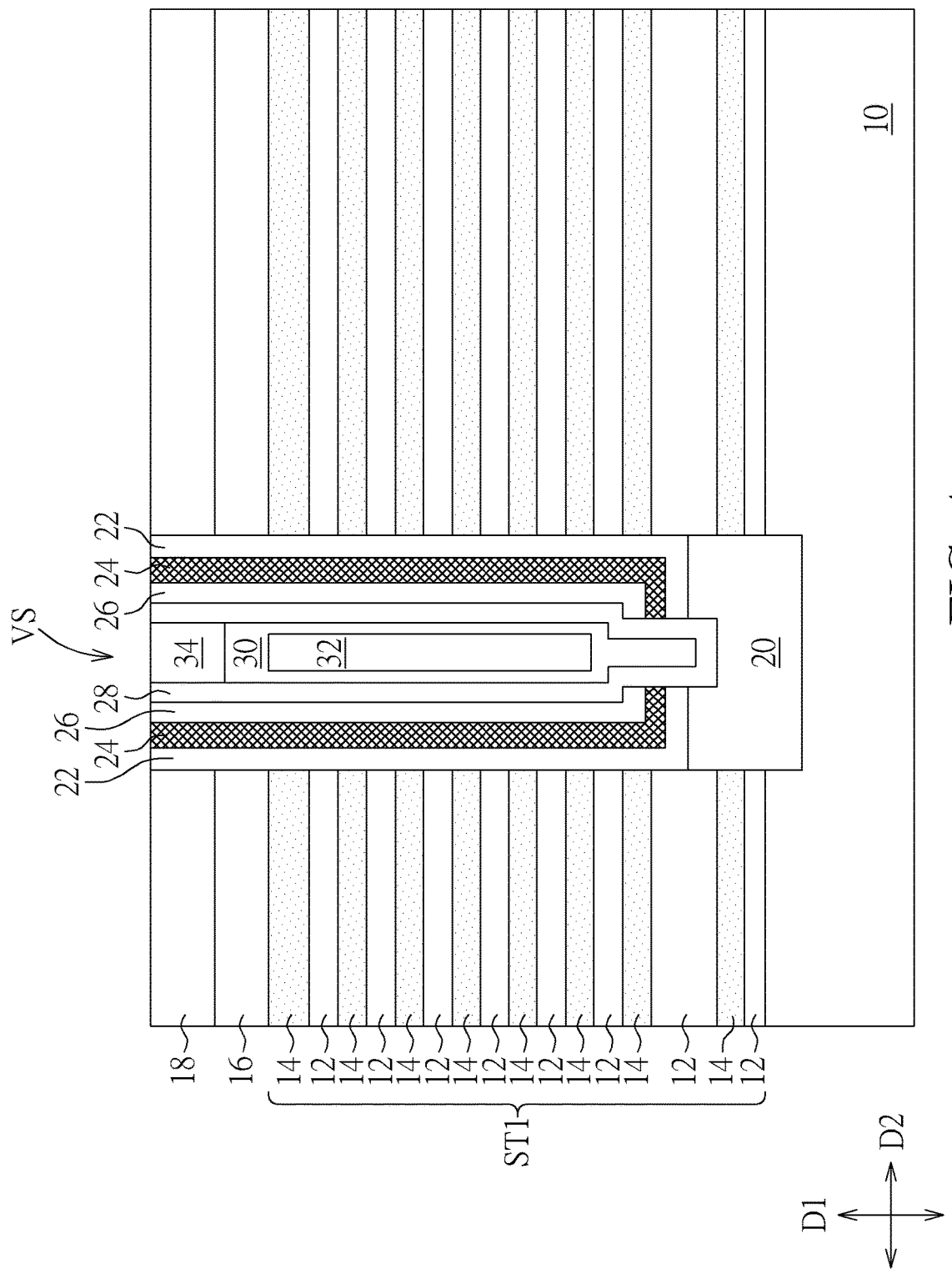
Figure 5:
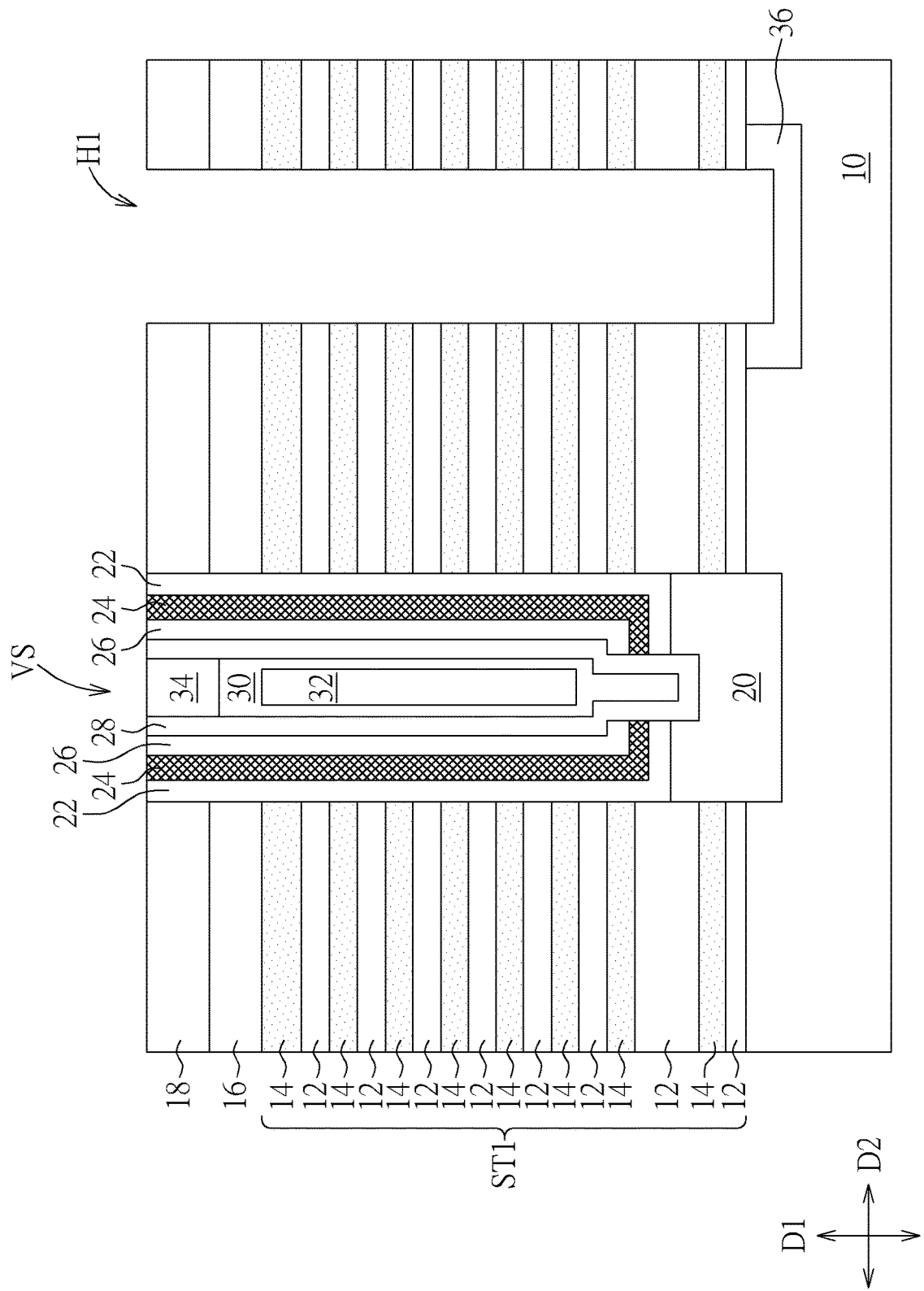
Figure 6:
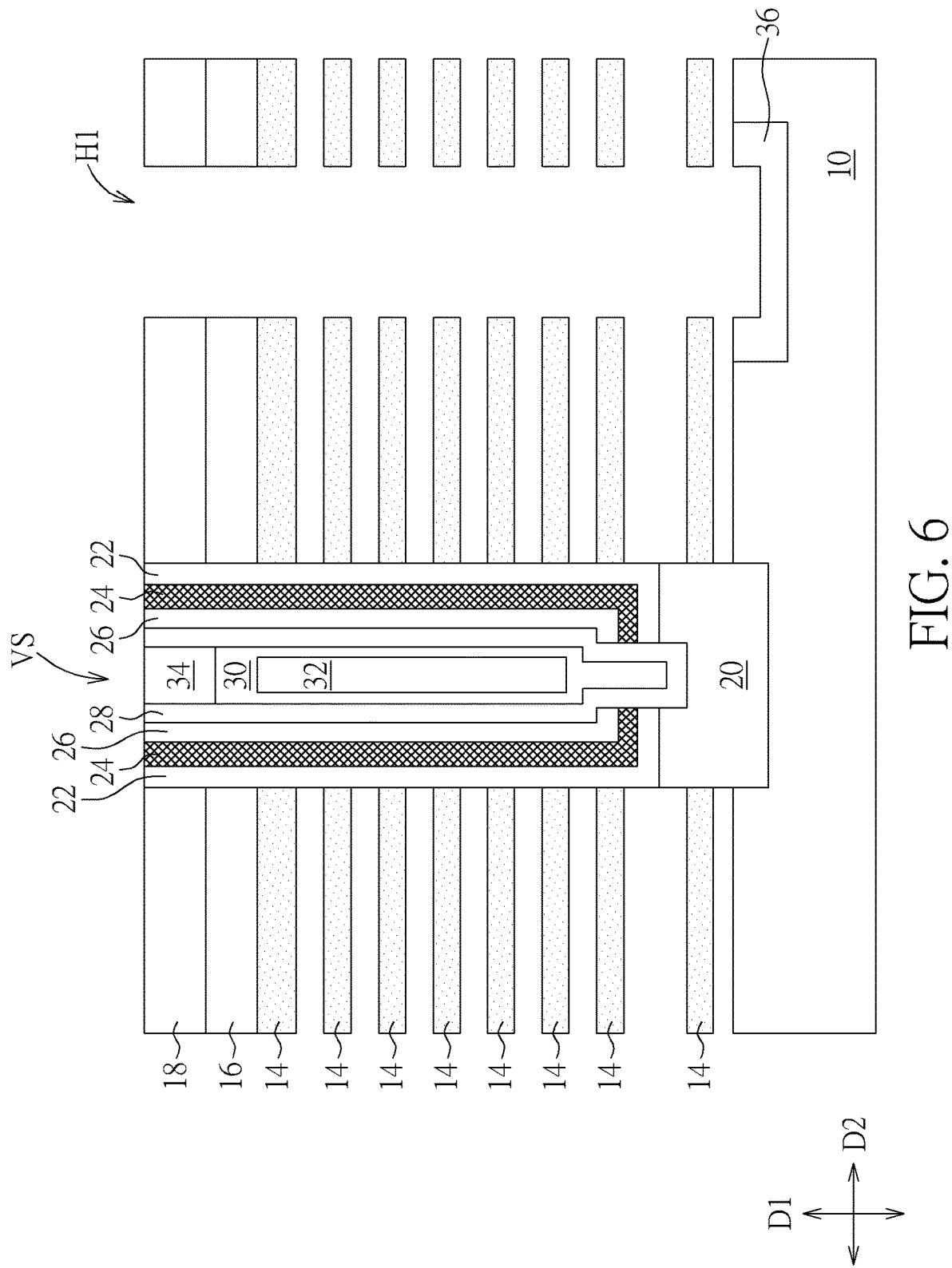
Figure 7:
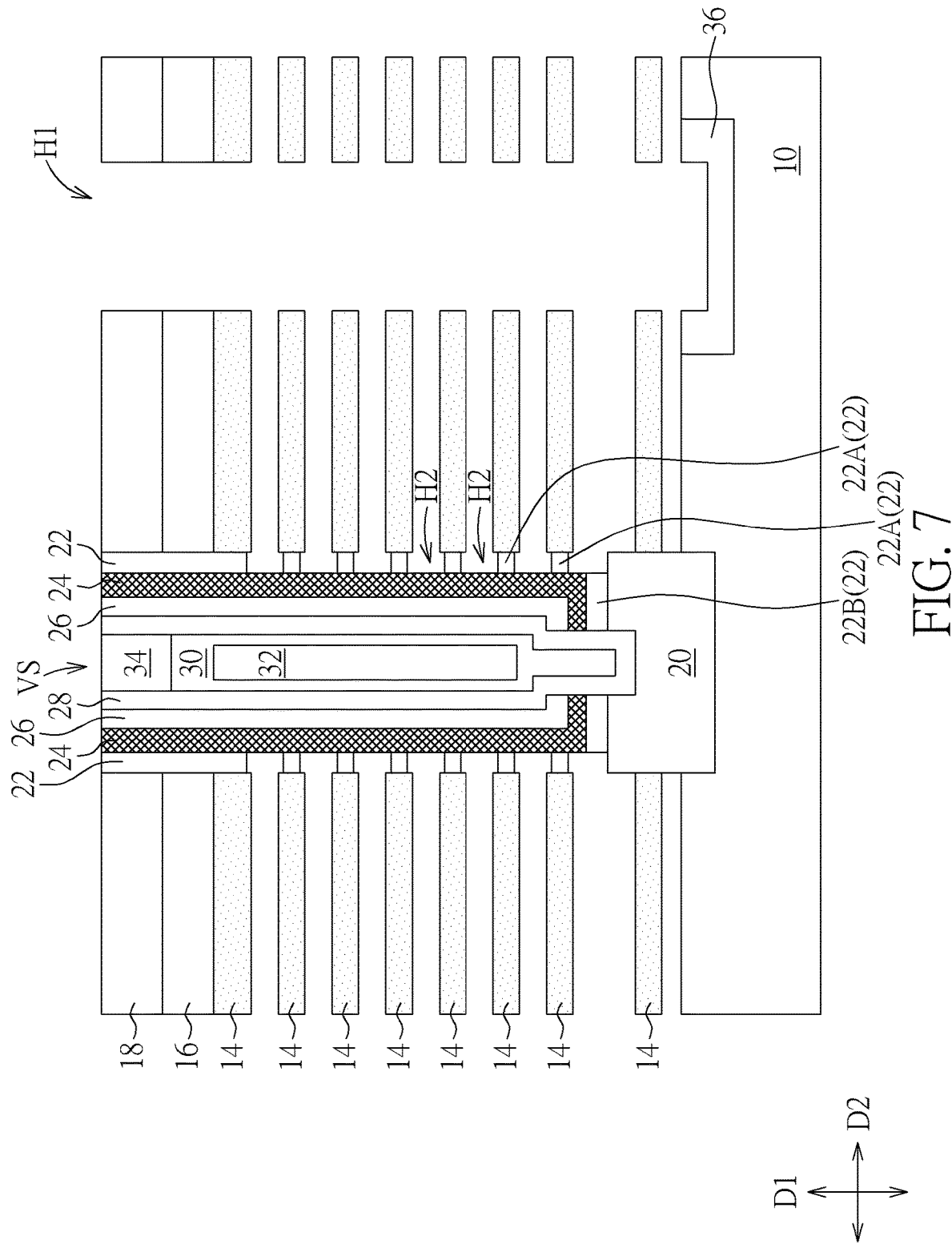
Figure 8:
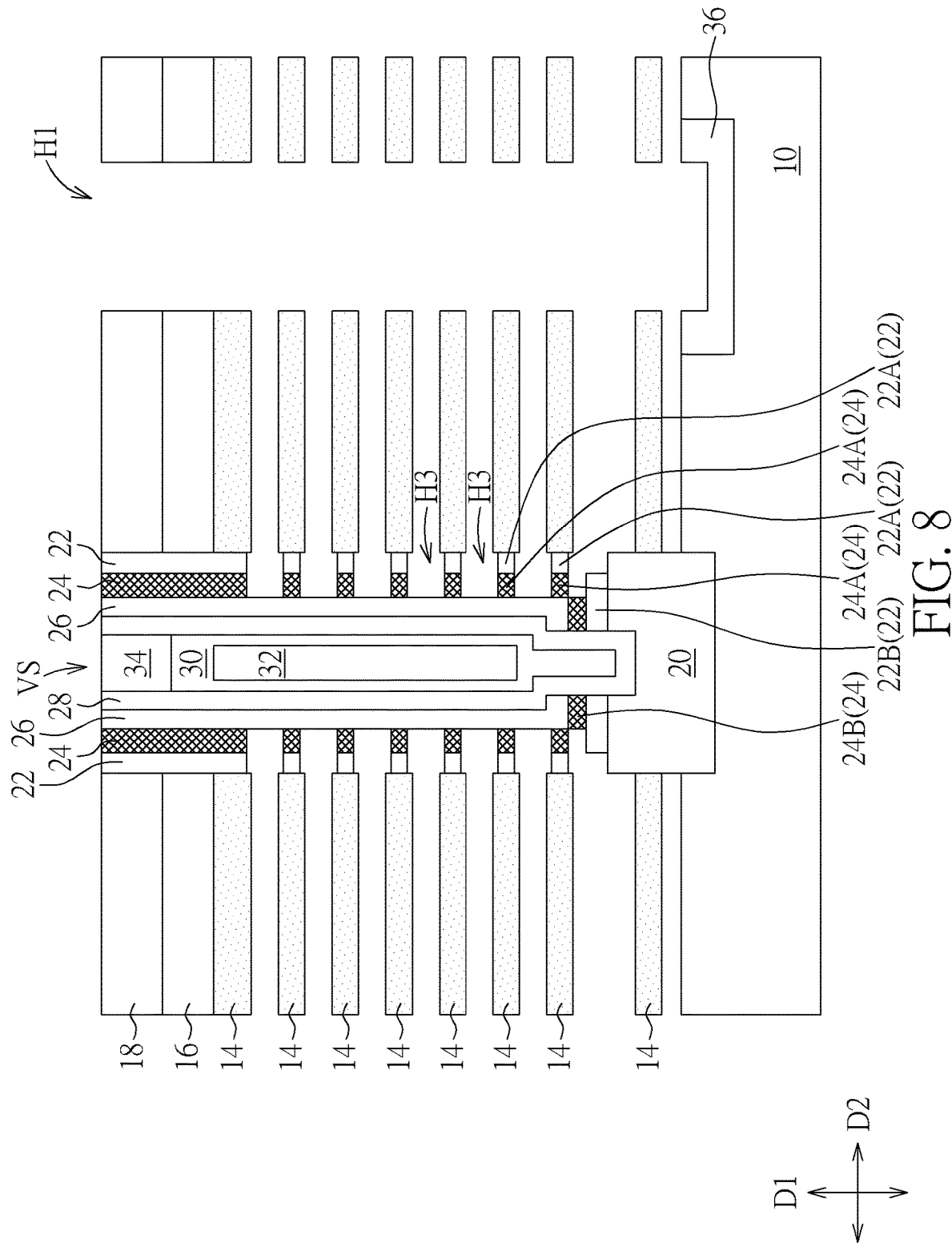
Figure 9:
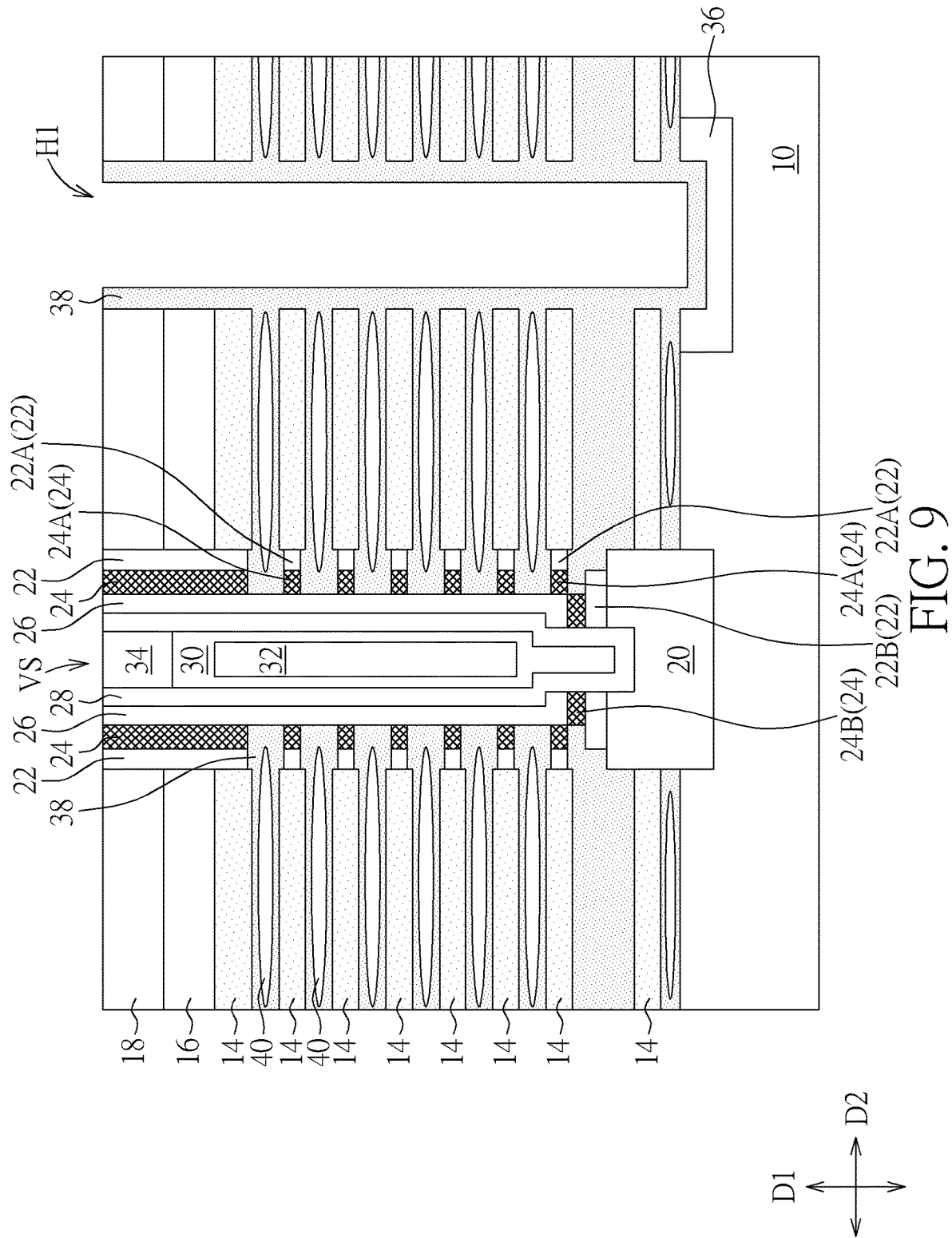
Figure 10:
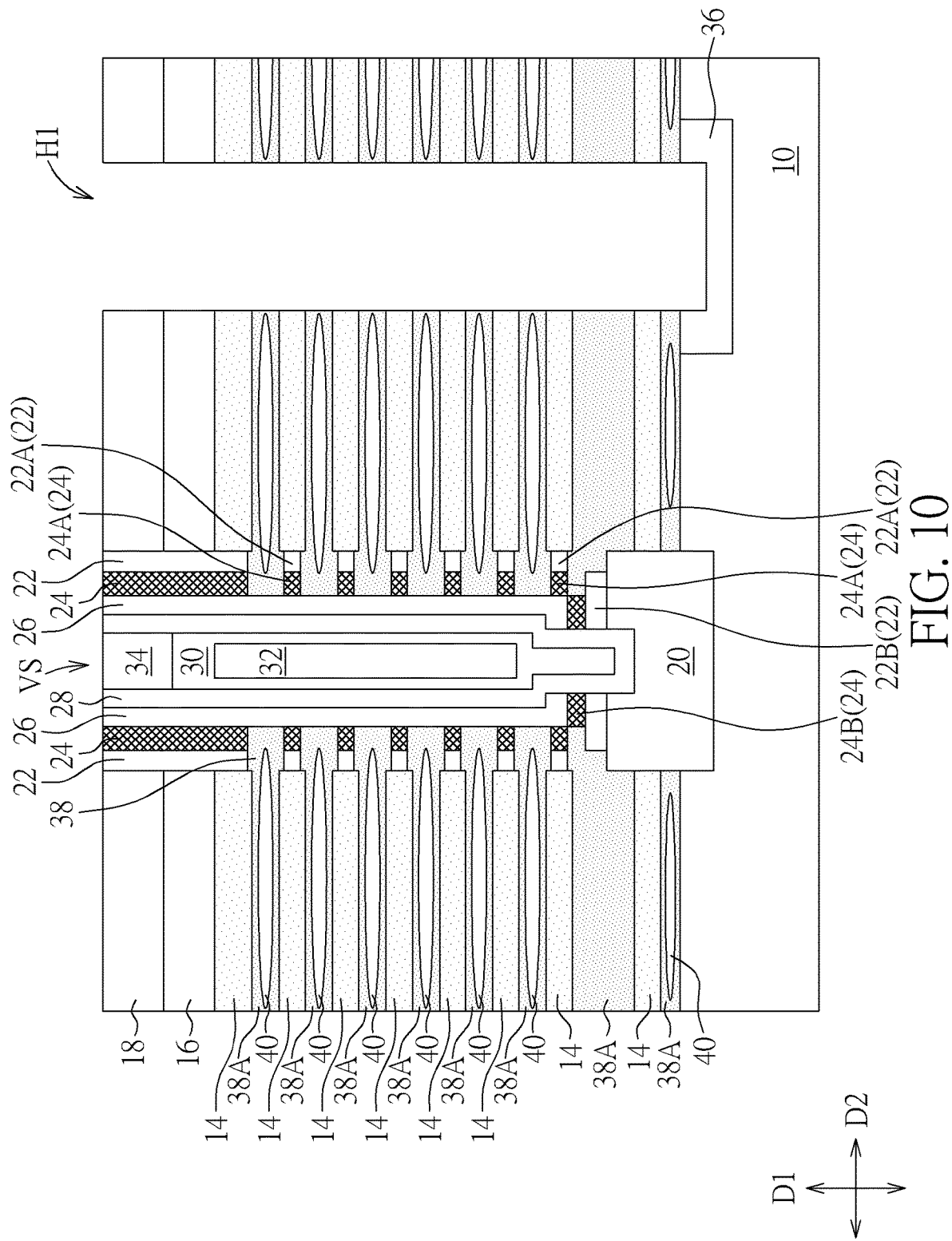
Figure 11:
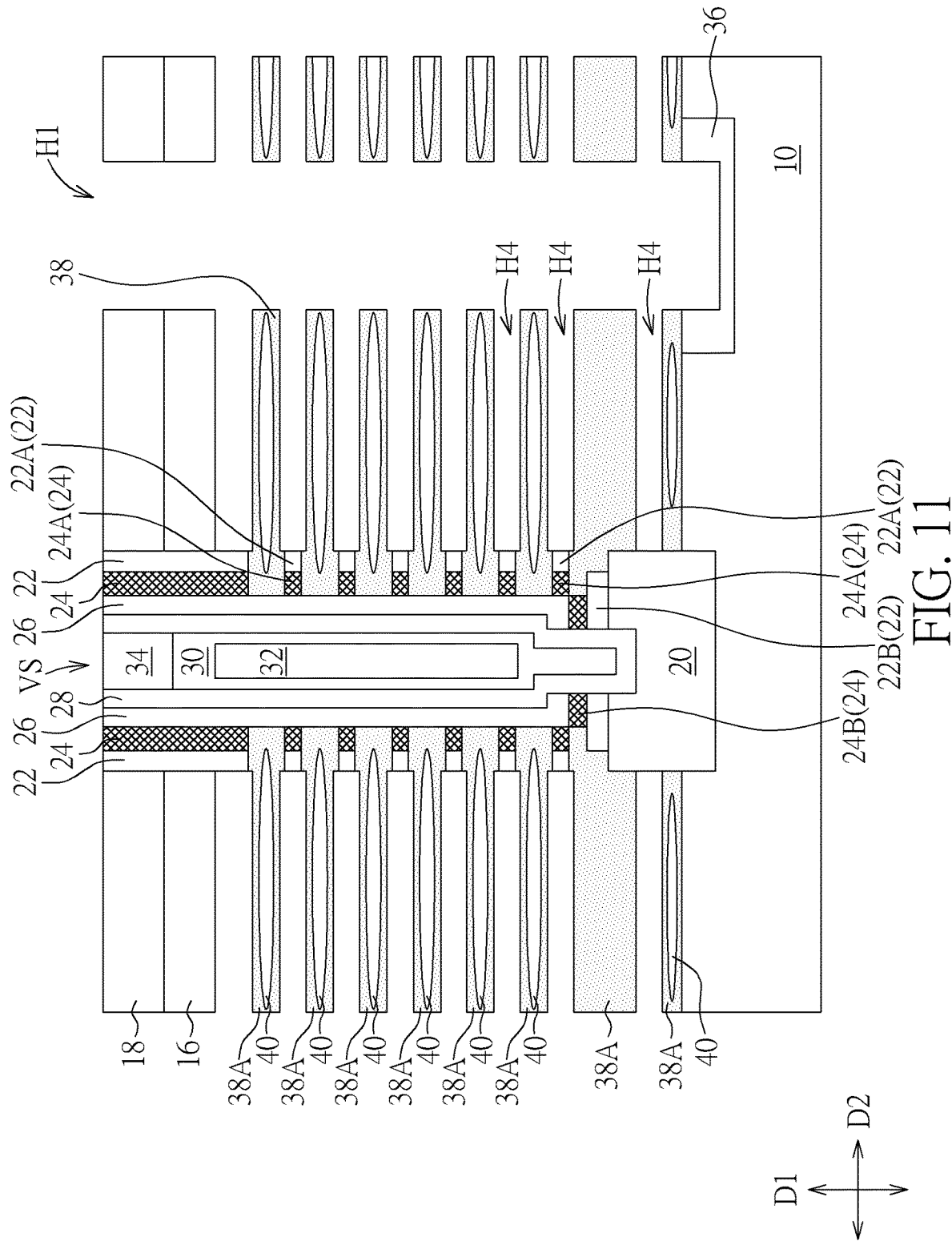
Figure 12:
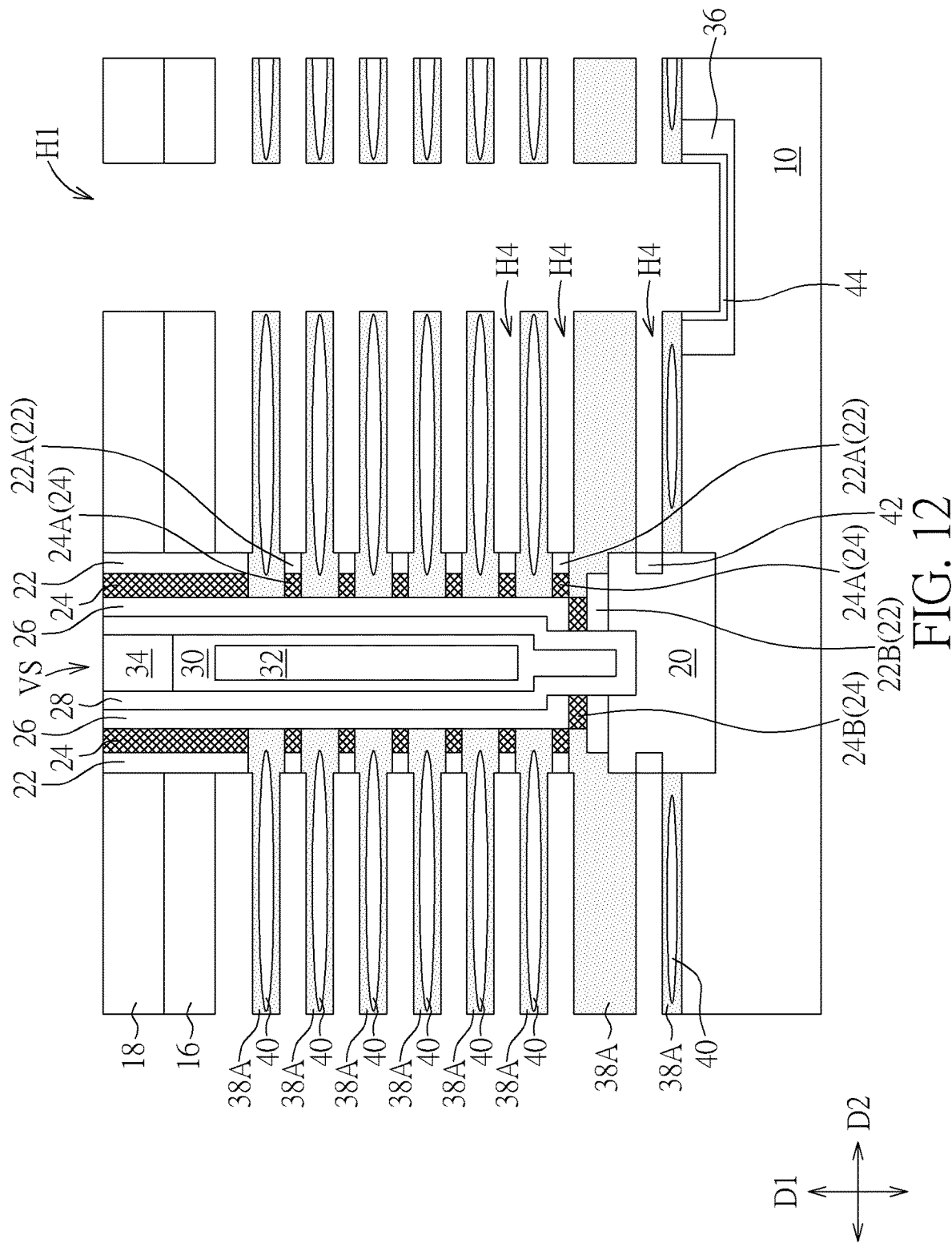
Figure 13:
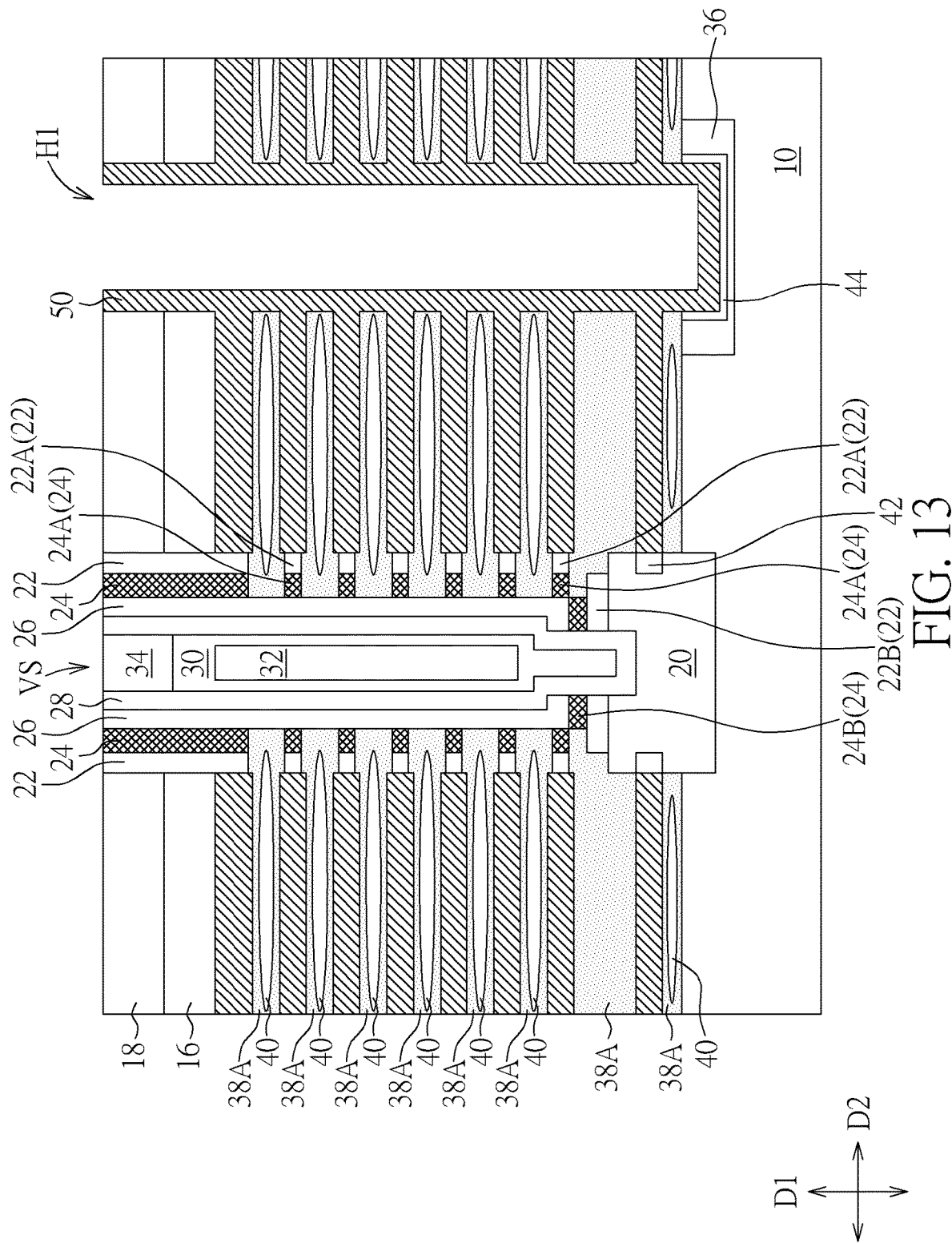
Figure 14:
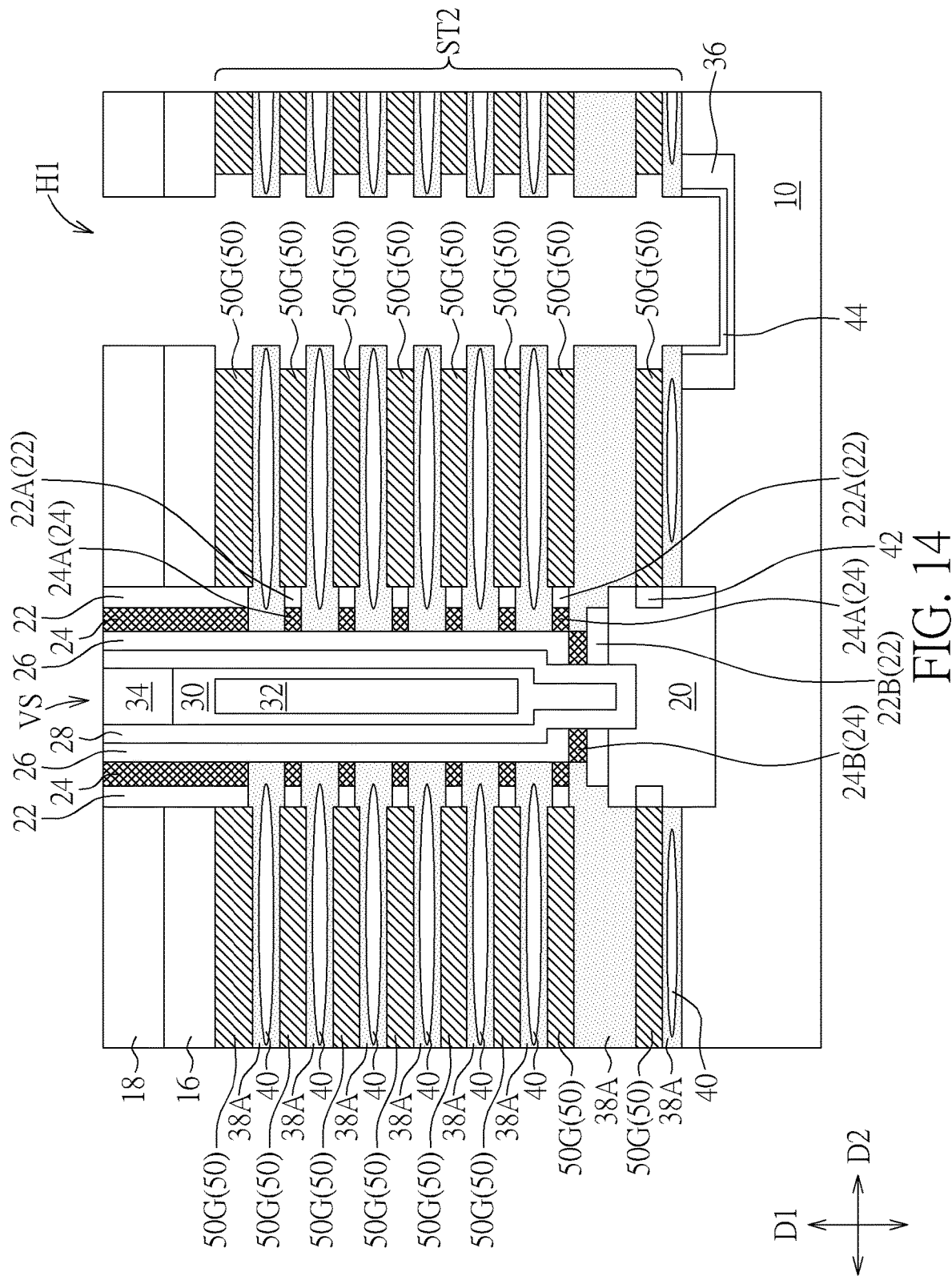
Figure 15:
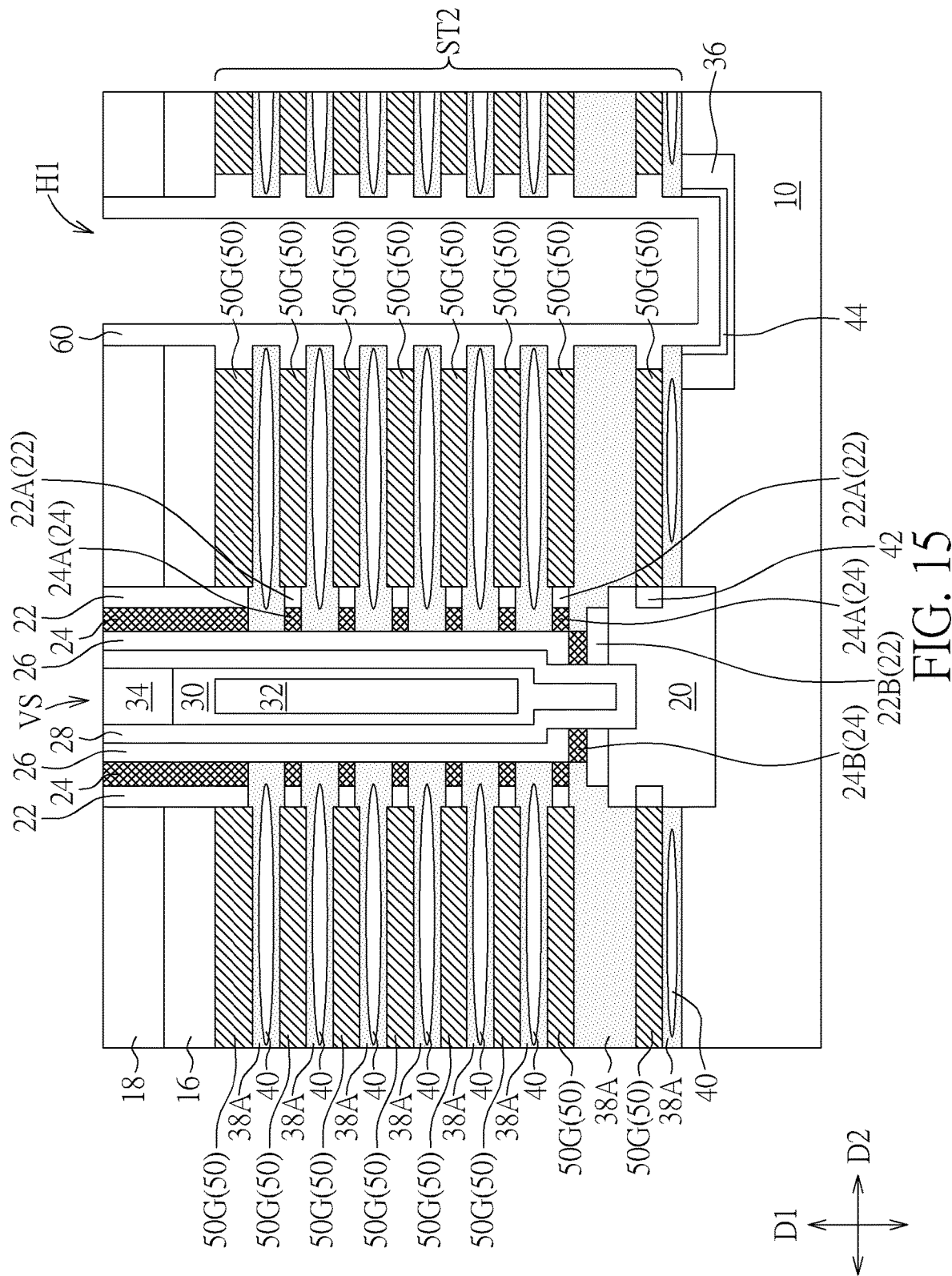

Please refer to FIGS. 3-15 and FIGS. 1-2. FIG. 3 is a flowchart of a manufacturing method of a 3D memory device according to an embodiment of the present disclosure, and FIGS. 4-15 are schematic drawings illustrating the manufacturing method of the 3D memory device in this embodiment. FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, and FIG. 1 may be regarded as a schematic drawing in a step subsequent to FIG. 15. The manufacturing method of the 3D memory device 100 may include but is not limited to the following steps. As shown in FIG. 4, the substrate 10 is provided, and an alternating sacrificial stack ST1 is formed on the substrate 10. In some embodiments, the substrate 10 may include silicon (e.g., monocrystalline silicon, polycrystalline silicon), silicon germanium (SiGe), silicon carbide (SiC), gallium nitride (GaN), indium phosphide (InP), gallium arsenide (GaAs), germanium (Ge), silicon on insulator (SOI), germanium on insulator (GOI), or any suitable combination thereof. The alternating sacrificial stack ST1 may include a plurality of first sacrificial layers 12 and a plurality of second sacrificial layers 14 alternately stacked in the vertical direction D1. The material composition of the first sacrificial layer 12 is different from the material composition of the second sacrificial layer 14 for providing required etching selectivity in subsequent processes. For example, the material of the first sacrificial layer 12 may include silicon oxide or silicon nitride, and the material of the second sacrificial layer 14 may include polysilicon, but not limited thereto. In some embodiments, the first sacrificial layers 12 and the second sacrificial layers 14 may also be made of other suitable materials with the required etching selectivity. In some embodiments, the total numbers of the first sacrificial layers 12 and the second sacrificial layers 14 in the alternating sacrificial stack ST1 may be 32 or 64, but not limited thereto.

As shown in FIG. 3 and FIG. 4, in step S11, the vertical structure VS may be formed penetrating the alternating sacrificial stack ST1 in the vertical direction D1. In some embodiments, the first cap layer 16 and the second cap layer 18 may be formed before the step of forming the vertical structure VS, and the vertical structure VS may further penetrate the second cap layer 18 and the first cap layer 16 in the vertical direction D1. In some embodiments, the first cap layer 16 and the second cap layer 18 may include dielectric materials different from the material of the first sacrificial layer 12 and the material of the second sacrificial layer 14 for avoiding being etched by a subsequent process configured to remove the first sacrificial layers 12 and a subsequent process configured to remove the second sacrificial layers 14.

In some embodiments, a forming method of the vertical structure VS may include but is not limited to the following steps. Firstly, an opening may be formed penetrating the alternating sacrificial stack ST1 in the vertical direction D1. In some embodiments, a shape of the opening in a top view of the 3D memory device may be a circle, a rectangle, or other suitable closed shapes. In some embodiments, a part of the substrate 10 may be exposed by the opening, and a part of the substrate 10 may be removed by the step of forming the opening. Subsequently, the epitaxial layer 20 may be formed in the opening, and the blocking layer 22, the trapping layer 24, and the tunneling layer 26 may then be formed above the epitaxial layer 20 in the vertical direction D1. In some embodiments, the epitaxial layer 20 may be a polysilicon layer formed by a selective epitaxial growth (SEG) process, and the epitaxial layer 20 may grow at the surface of the substrate 10 exposed by the opening, but not limited thereto. The epitaxial layer 20 may include other suitable epitaxial materials and/or be formed by other suitable processes in some embodiments. Additionally, the blocking layer 22, the trapping layer 24, and the tunneling layer 26 may be formed by deposition processes, such as atomic layer deposition (ALD) processes, chemical vapor deposition (CVD) processes, or other suitable film-forming processes. In some embodiments, the blocking layer 22 may include silicon oxide, silicon oxynitride, high dielectric constant (high-k) dielectrics, or any combination thereof, the trapping layer 24 may include silicon nitride, silicon oxynitride, silicon, or any combination thereof, and the tunneling layer 26 may include silicon oxide, silicon oxynitride, or any combination thereof. For example, the blocking layer 22, the trapping layer 24, and the tunneling layer 26 may be may be an oxide-nitride-oxide (ONO) structure, but not limited thereto.

Subsequently, an opening may be formed penetrating the bottom portion of the blocking layer 22, the bottom portion of the trapping layer 24, and the bottom portion of the tunneling layer 26 in the vertical direction D1 and exposing a part of the epitaxial layer 20, and the semiconductor layer 28 may be formed in the opening penetrating the alternating sacrificial stack ST1 and be formed in the opening penetrating the blocking layer 22, the trapping layer 24, and the tunneling layer 26. The semiconductor layer 28 may be elongated in the vertical direction D1, and the semiconductor layer 28 may be surrounded by the tunneling layer 26, the trapping layer 24, and the blocking layer 22 in the horizontal direction D2. The filling layer 30 and the conductive structure 34 may be formed after the step of forming the semiconductor layer 28. The filling layer 30 may be surrounded by the semiconductor layer 28, the tunneling layer 26, the trapping layer 24, and the blocking layer 22 in the horizontal direction D2. In some embodiments, the semiconductor layer 28 may include amorphous silicon, polysilicon, or other suitable semiconductor materials, and the filling layer 30 may include oxide or other suitable insulation materials, but not limited thereto. The conductive structure 34 may be formed on a recess above the filling layer 30, and the conductive structure 34 may include polysilicon or other suitable conductive materials. In some embodiments, the tunneling layer 26 may be used for tunneling electronic charges (electrons or holes). Electrons or holes from the semiconductor layer 28 may tunnel to the trapping layer 24 through the tunneling layer 26, and the trapping layer 24 may be used for storing electronic charges (electrons or holes) for memory operation, but not limited thereto. Therefore, the vertical structure VS may include the epitaxial layer 20, the blocking layer 22, the trapping layer 24, the tunneling layer 26, the semiconductor layer 28, the filling layer 30, the first air void 32, and the conductive structure 34, but not limited thereto.

As shown in FIG. 5, the first opening H1 may be formed penetrating the second cap layer 18, the first cap layer 16, and the alternating sacrificial stack ST1 and exposing a part of the substrate 10 after the step of forming the vertical structure VS, and the doped region 36 may be formed in the substrate 10 exposed by the first opening H1. In some embodiments, the doped region 36 may be formed by an implantation process or other suitable doping approaches. In some embodiments, the doped region 36 may be regarded as a common source region, and the first opening H1 may be regarded as a common source trench, but not limited thereto. In some embodiments, a patterned mask layer (not shown) may be formed covering the vertical structure VS before the step of forming the first opening H1 for protecting the vertical structure VS from being damaged and/or influenced by the steps of forming the first opening H1 and the doped region 36, and the patterned mask layer may be removed after the doped region 36 is formed, but not limited thereto. In some embodiments, the vertical structure VS may not penetrate the second cap layer 18, and the second cap layer 18 may cover the vertical structure VS during subsequent processes for protecting the vertical structure VS from being damaged and/or influenced by the subsequent processes, but not limited thereto.

As shown in FIG. 3 and FIG. 6, in step S12, the first sacrificial layers 12 in the alternating sacrificial stack ST1 may be removed for exposing a part of the vertical structure VS after the step of forming the doped region 36. In some embodiments, the first sacrificial layers 12 may be removed by a wet etching process or other suitable removing approaches capable of completely removing the first sacrificial layers 12 without damaging other material layers. As shown in FIGS. 3, 6, and 7, in step S13, an etching process may be performed for removing a part of the blocking layer 22 exposed by the step of removing the first sacrificial layers 12. The blocking layer 22 may be etched by the etching process to expose a part of the trapping layer 24, and the blocking layer 22 may be etched by the etching process to include the first blocking sections 22A and the second blocking section 22B. In other words, a portion of the blocking layer 22 may be etched by the etching process to become the first blocking sections 22A, and another portion of the blocking layer 22 may be etched by the etching process to become the second blocking sections 22B. A plurality of second openings H2 may be formed penetrating the blocking layer 22 in the horizontal direction D2 and expose a part of the trapping layer 24. The first blocking sections 22A may be aligned in the vertical direction D1 and separated from one another. The first blocking sections 22A may be disposed above the second blocking section 22B in the vertical direction D1, and the second blocking section 22B may be disposed separated from the first blocking sections 22A.

As shown in FIGS. 3, 7, and 8, in step S14, another etching process may be performed for removing a part of the trapping layer 24 exposed by the second openings H2. The trapping layer 24 may be etched by the etching process to expose a part of the tunneling layer 26, and the trapping layer 24 may be etched by the etching process to include the first trapping sections 24A and the second trapping section 24B. In other words, a portion of the trapping layer 24 may be etched by the etching process to become the first trapping sections 24A, and another portion of the trapping layer 24 may be etched by the etching process to become the second trapping sections 24B. A plurality of third openings H3 may be formed penetrating the trapping layer 24 in the horizontal direction D2 and expose a part of the tunneling layer 26. The first trapping sections 24A may be aligned in the vertical direction D1 and separated from one another. The first trapping sections 24A may be disposed above the second trapping section 24B in the vertical direction D1, and the second trapping section 24B may be disposed separated from the first trapping sections 24A, but not limited thereto. In some embodiments, the second trapping section 24B may be directly connected with the bottommost first trapping section 24A. In some embodiments, the etching process configured to etch the trapping layer 24 may be regarded as a first etching process, and the etching process configured to etch the blocking layer 22 may be regarded as a second etching process performed before the first etching process. The first etching process and the second etching process may be performed after the step of removing the first sacrificial layers. In some embodiments, the first etching process and the second etching process may include wet etching processes or other suitable etching approaches with high etching selectivity. In some embodiments, the etchant used in the first etching process may be different from the etchant used in the second etching process especially when the material of the tunneling layer 26 is similar to the material of the blocking layer 22, but the present disclosure is not limited to this. In some embodiments, the blocking layer 22 and the trapping layer 24 may also be etched by the same etching process for forming the first blocking sections 22A and the first trapping sections 24A.

As shown in FIGS. 3, 9, and 10, in step S15, the insulation layers 38A may be formed between the second sacrificial layers 14 in the vertical direction D1. In some embodiments, a first insulation material 38 may be partly formed between the second sacrificial layers 14 and partly formed in the first opening H1 by a CVD process or other suitable film-forming processes. The first insulation material 38 may include oxide, nitride, oxynitride, or other suitable insulation materials. The first insulation material 38 formed in the first opening H1 may be removed subsequently for forming the insulation layers 38A between the second sacrificial layers 14. Therefore, the insulation layers 38A and the second sacrificial layers 14 may be alternately stacked in the vertical direction D1. In some embodiments, one of the insulation layers 38A may be partially located between two of the first trapping sections 24A adjacent to each other in the vertical direction D1. In other words, two of the first trapping sections 24A adjacent to each other in the vertical direction D1 may be separated by the insulation layer 38A. In some embodiments, one or more second air voids 40 may be formed in one of the insulation layers 38A especially when the distance between two of the second sacrificial layers 14 located adjacent to each other in the vertical direction D1 is extremely short and/or the gap-filling ability of the first insulation material 38 is relatively worse. The second air void 40 may be located between two of the second sacrificial layers 14 adjacent to each other in the vertical direction D1. In some embodiments, the second air void 40 may be partially located between two of the first blocking sections 22A disposed adjacent to each other in the vertical direction D1 and/or be partially located between two of the first trapping sections 24A disposed adjacent to each other in the vertical direction D1, but not limited thereto.

As shown in FIG. 3 and FIGS. 10-15, in step S16, the second sacrificial layers 14 may be replaced with the gate material layers 50G after the step of forming the insulation layers 38A. The method of replacing the second sacrificial layers 14 with the gate material layers 50G may include but is not limited to the following steps. As shown in FIG. 10 and FIG. 11, the second sacrificial layers 14 may be removed for forming the a plurality of fourth openings H4 between the insulation layers 38A in the vertical direction D1. In some embodiments, the fourth openings H4 may be regarded as gate trenches, and the second sacrificial layers 14 may be removed by a wet etching process or other suitable removing approaches capable of completely removing the second sacrificial layers 14 without damaging other material layers, but not limited thereto. In some embodiments, a part of the doped region 36 exposed by the first opening H1 may be removed by the etching process configured to remove the second sacrificial layers 14 when the material of the second sacrificial layer 14 is similar to the material of the substrate 10.

As shown in FIGS. 10-12, in some embodiments, a part of the epitaxial layer 20 may be oxidized to be the first oxide region 42 by an oxidation process after the step of removing the second sacrificial layers 14 and before the step of forming the gate material layers. In some embodiments, one of the fourth openings H4 may expose a part of the epitaxial layer 20, and the first oxide region 42 may be formed in the epitaxial layer 20 exposed by the fourth opening H4. In some embodiments, the oxidation process for forming the first oxide region 42 may include a thermal oxidation process, a chemical oxidation process, or other suitable oxidation approaches, and a part of the doped region 36 may be oxidized by the oxidation process to be the second oxide region 44, but not limited thereto. As shown in FIG. 13, a gate material 50 may be partly formed between the insulation layers 38A and partly formed in the first opening H1. In some embodiments, the gate material 50 may be a single conductive material or a composite material including different material layers, such as the gate dielectric layer 52, the barrier layer 54, and the metal layer 56 shown in FIG. 2 described above. In some embodiments, the gate dielectric layer 52 may include a high-k dielectric material or other suitable dielectric material, the barrier layer 54 may include titanium nitride, tantalum nitride, or other suitable barrier materials, and the metal layer 56 may include metallic materials having relatively lower resistivity, such as copper, aluminum, tungsten, or other suitable metallic materials.

As shown in FIG. 13 and FIG. 14, the gate material 50 formed in the first opening H1 may be removed subsequently for forming the gate material layers 50G between the insulation layers 38A. Therefore, the insulation layers 38A and the gate material layers 50G may be alternately stacked in the vertical direction D1 for forming the alternating dielectric/gate material stack ST2. In some embodiments, the gate material layers 50G may be recessed in the horizontal direction D2, but not limited thereto. In some embodiments, the second air void 40 may be located between two of the gate material layers 50G adjacent to each other in the vertical direction D1 for reducing the capacitance between the gate material layers 50G and improving RC delay issue between the gate material layers 50G. In some embodiments, the first oxide region 42 may be located between the epitaxial layer 20 and one of the gate material layers 50G in the horizontal direction D2, and the first oxide region 42 may be regarded as a part of a gate dielectric layer of a BSG transistor in a NAND memory structure, but not limited thereto.

As shown in FIG. 15 and FIG. 1, in some embodiments, the second insulation material 60 may be formed in the first opening H1, and the slit structure 70 may be formed penetrating the second insulation material 60 and the second oxide region 44 above the doped region 36 for being contacting and electrically connected with the doped region 36. In some embodiments, the second insulation material 60 may include silicon oxide or other suitable insulation materials, and the slit structure 70 may include a conductive material, such as tungsten, copper, aluminum, or other suitable conductive materials.

To summarize the above descriptions, in the 3D memory device and the manufacturing method thereof according to the present disclosure, the trapping layer includes a plurality of the first trapping sections aligned in the vertical direction and separated from one another for reducing interference between adjacent memory units. Related issues, such as the lateral spreading of charge in a continuous trapping layer located corresponding to a plurality of memory units arranged in the vertical direction and/or the coupling effect generated by charge trapped in a trapping layer located between the insulation layer and the semiconductor layer in the horizontal direction may be avoided, and the electrically performance of the 3D memory device may be improved accordingly. In addition, the air void may be formed in the insulation layer disposed between two of the gate material layers adjacent to each other in the vertical direction for reducing the capacitance between the gate material layers and improving RC delay issue between the gate material layers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional (3D) memory device, comprising:
a substrate;
insulation layers disposed on the substrate;
gate material layers disposed on the substrate, wherein the insulation layers and the gate material layers are alternately stacked in a vertical direction;
a vertical structure penetrating the gate material layers in the vertical direction, wherein the vertical structure comprises:
a semiconductor layer elongated in the vertical direction;
a trapping layer surrounding the semiconductor layer in a horizontal direction, wherein the trapping layer comprises trapping sections aligned in the vertical direction and separated from one another, and a length of each of the trapping sections in the vertical direction is less than a length of each of the gate material layers in the vertical direction; and
a tunneling layer disposed between the semiconductor layer and the trapping layer; and
an air void disposed in at least one of the insulation layers, wherein the air void is located between two of the gate material layers adjacent to each other in the vertical direction, and the air void is separated from the tunneling layer by a portion of the at least one of the insulation layers,
wherein the trapping sections comprises first trapping sections and a second trapping section, the first trapping sections are disposed above the second trapping section in the vertical direction, and the semiconductor layer penetrates through the second trapping section in the vertical direction, wherein the entire second trapping section is completely disposed under the tunneling layer in the vertical direction, and the second trapping section is separated from each of the first trapping sections, wherein one of the insulation layers is directly connected with the second trapping section completely disposed under the tunneling layer in the vertical direction and one of the first trapping sections, wherein a material composition of the one of the insulation layers directly connected with the second trapping section completely disposed under the tunneling layer in the vertical direction is identical to a material composition of the one of the insulation layers directly connected with the one of the first trapping sections.

2. The 3D memory device according to claim 1, wherein one of the first trapping sections is located between the semiconductor layer and one of the gate material layers in the horizontal direction.

3. The 3D memory device according to claim 1, wherein one of the insulation layers is partially located between two of the first trapping sections adjacent to each other in the vertical direction.

4. The 3D memory device according to claim 1, wherein the vertical structure further comprises a blocking layer surrounding the trapping layer and the semiconductor layer in the horizontal direction, and the blocking layer comprises blocking sections aligned in the vertical direction and separated from one another.

5. The 3D memory device according to claim 4, wherein one of the blocking sections is disposed between one of the first trapping sections and one of the gate material layers in the horizontal direction.

6. The 3D memory device according to claim 1, wherein the vertical direction is orthogonal to the horizontal direction.

7. The 3D memory device according to claim 1, wherein each of the insulation layers is oxide, nitride, or oxynitride.

8. The 3D memory device according to claim 1, wherein the one of the insulation layers directly connected with the second trapping section completely disposed under the tunneling layer in the vertical direction and the one of the first trapping sections is completely disposed under the first trapping sections in the vertical direction.

9. The 3D memory device according to claim 1, wherein the one of the insulation layers directly connected with the second trapping section completely disposed under the tunneling layer in the vertical direction and the one of the insulation layers directly connected with the one of the first trapping sections are directly connected with each other.

* * * * *